US007047144B2

(12) United States Patent
Steiner

(10) Patent No.: US 7,047,144 B2
(45) Date of Patent: May 16, 2006

(54) ION DETECTION IN MASS SPECTROMETRY WITH EXTENDED DYNAMIC RANGE

(75) Inventor: Urs Steiner, Sunnyvale, CA (US)

(73) Assignee: Varian, Inc., Palo Alto, CA (US)

(*) Notice: Subject to any disclaimer, the term of this patent is extended or adjusted under 35 U.S.C. 154(b) by 0 days.

(21) Appl. No.: 10/963,706

(22) Filed: Oct. 13, 2004

(65) Prior Publication Data

US 2006/0080045 A1 Apr. 13, 2006

(51) Int. Cl.
*G01R 19/00* (2006.01)

(52) U.S. Cl. ........................... 702/64; 702/65; 702/107

(58) Field of Classification Search .................. 702/64, 702/65, 106, 126, 189, 107; 250/281, 282, 250/287, 288, 292, 300
See application file for complete search history.

(56) References Cited

U.S. PATENT DOCUMENTS 3,946,229 A * 3/1976 Moseman et al. .......... 250/292
6,576,897 B1 6/2003 Steiner et al.
2004/0084613 A1 * 5/2004 Bateman et al. ............ 250/281

* cited by examiner

*Primary Examiner*—Bryan Bui
(74) *Attorney, Agent, or Firm*—Bella Fishman

(57) ABSTRACT

In a method for optimizing an ion detector a control voltage, such as in a mass spectrometry system, an array of mass scan data is acquired. Based on the size of the largest peak in the array or part of the array, a determination is made as to whether the current detector gain should be changed to a new detector gain. If the current detector gain should be changed, the control voltage for the subsequent mass scan is adjusted to a new control voltage corresponding to the new detector gain. The data are scaled based on the current detector gain. In another method, a gain versus control voltage curve is generated for calibration. These methods may be implemented by hardware, software, analog or digital circuitry, and/or computer-readable or signal-bearing media.

20 Claims, 3 Drawing Sheets

ION DETECTION IN MASS SPECTROMETRY WITH EXTENDED DYNAMIC RANGE

FIELD OF THE INVENTION

The present invention relates generally to the detection of ions by means of ion-to-current conversion, which finds use, for example, in fields of analytical chemistry such as mass spectrometry. More particularly, the present invention relates to improving the performance of a mass spectrometer, including its dynamic range, through control of an ion detector of the mass spectrometer.

BACKGROUND OF THE INVENTION

Mass spectrometry (MS) describes a variety of instrumental methods of qualitative and quantitative analysis that enable sample components to be resolved according to their mass-to-charge ratios. For this purpose, a mass spectrometer converts the components of a sample into ions, sorts or separates the ions based on their mass-to-charge ratios, and processes the resulting ion output (for example, ion current, flux, beam, et cetera) as needed to produce a mass spectrum. Typically, a mass spectrum is a series of peaks indicative of the relative abundances of charged components as a function of mass-to-charge ratio. The term "mass-to-charge" is often expressed as m/z or m/e, or simply "mass" given that the charge z or e often has a value of 1. The information represented by the ion output can be encoded as electrical signals through the use of an appropriate transducer to enable data processing by both analog and digital techniques. An ion detector is a type of transducer that converts ion current to electrical current and thus is commonly employed in an MS system.

Insofar as the present disclosure is concerned, MS systems are generally known and need not be described in detail. Briefly, a typical MS system generally includes a sample inlet system, an ion source or ionization system, a mass analyzer (also termed a mass sorter or mass separator) or multiple mass analyzers, an ion detector, a signal processor, and readout/display means. Additionally, the modern MS system includes an electronic controller such as a computer or other electronic processor-based device for controlling the functions of one or more components of the MS system, storing information produced by the MS system, providing libraries of molecular data useful for analysis, and the like. The electronic controller may include a main computer that includes a terminal, console or the like for enabling interface with an operator of the MS system, as well as one or more modules or units that have dedicated functions such as data acquisition and manipulation. The MS system also includes a vacuum system to enclose the mass analyzer(s) in a controlled, evacuated environment. In addition to the mass analyzer(s), depending on design, all or part of the sample inlet system, ion source, and ion detector may also be enclosed in the evacuated environment.

In operation, the sample inlet system introduces a small amount of sample material to the ion source, which may be integrated with the sample inlet system depending on design. In hyphenated techniques, the sample inlet system may be the output of an analytical separation instrument such as a gas chromatographic (GC) instrument, a liquid chromatographic (LC) instrument, a capillary electrophoresis (CE) instrument, a capillary electrochromatography (CEC) instrument, or the like. The ion source converts components of the sample material into a stream of positive and negative ions. One ion polarity is then accelerated into the mass analyzer. The mass analyzer separates the ions according to their respective mass-to-charge ratios. Many mass analyzers are capable of distinguishing between very minute differences in m/z ratio among the ions being analyzed. The mass analyzer produces a flux of ions resolved according to m/z ratio and the ions are collected at the ion detector.

In other hyphenated techniques, such as tandem MS or MS/MS, more than one mass analyzer (and more than one type of mass analyzer) may be used. As one example, an ion source may be coupled to a multipole (for example, quadrupole) structure that acts as a first stage of mass separation to isolate molecular ions of a mixture. The first analyzer may in turn be coupled to another multipole structure (normally operated in an RF-only mode) that performs a collision-focusing function and is often termed a collision chamber or collision cell. A suitable collision gas such as argon is injected into the collision cell to cause fragmentation of the ions and thereby produce daughter ions. This second multipole structure may in turn be coupled to yet another multipole structure that acts as a second stage of mass separation to scan the daughter ions. Finally, the output of the second stage is coupled to an ion detector. Instead of multipole structures, magnetic and/or electrostatic sectors may be employed. Other examples of MS/MS systems include the Varian Inc. 1200 series of triple-quadrupole GC/MS systems commercially available from Varian, Inc., Palo Alto, Calif., and the implementations disclosed in U.S. Pat. No. 6,576,897, assigned to the assignee of the present disclosure.

As previously noted, the ion detector functions as a transducer that converts the mass-discriminated ionic information into electrical signals suitable for processing/conditioning by the signal processor, storage in memory, and presentation by the readout/display means. A typical ion detector includes, as a first stage, an ion-to-electron conversion device. Ions from the mass analyzer are focused toward the ion-to-electron conversion device by means of an electrical field and/or electrode structures that serve as ion optics. The electrical and structural ion optics are preferably designed so as to separate the ion beam from any neutral particles and electromagnetic radiation that may also be discharged from the mass analyzer, thereby reducing background noise and increasing the signal-to-noise (S/N) ratio. The ion-to-electron conversion device typically includes a surface that emits secondary electrons in response to impingement by ions, and the conversion efficiency can be different for each mass and its energy state at the time of impact. The ion conversion stage may be followed by an electron multiplier stage. The electron multiplier typically is a continuous-dynode type or a discrete-dynode type. In the continuous-dynode type, a voltage potential is impressed across the length of a containment structure of the electron multiplier. Ions enter the structure and strike an interior surface of the structure, which results in the surface emitting electrons (that is, the ion-to-electron conversion stage). The electrons then skip along the surface. With each impact of the electrons on the surface, additional electrons are liberated from the surface. The structure of the continuous-dynode electron multiplier is shaped to facilitate this cascading of electrons. By comparison, the discrete-dynode electron multiplier has a series of individual dynodes, with the first electrode constituting the ion-to-electron conversion stage. Each dynode is held at a successively higher voltage. Thus, after the ion input is converted into electrons, the electrons impact each dynode in succession. Each dynode has a surface that causes additional electrons to be emitted upon impact by incoming electrons. The dynodes are arranged in space to ensure impingement by the multiplying flux of electrons. Either type of electron multiplier typically includes an end electrode that serves as an anode for collecting the multiplied flux of electrons and transmitting an output electrical current to subsequent processes.

A photomultiplier may be substituted for an electron multiplier and operated in a similar manner. For example, a photomultiplier tube (PMT) typically includes a photo cathode surface that emits electrons when exposed to radiation, and a series of dynodes to achieve a cascading of electrons for ultimate collection at an anode and subsequent amplification and measurement.

Electron multipliers such as those just described provide a current gain that may range, for example, from $10^3$ to $10^9$. In the present context, the gain of the electron multiplier is the ratio of its output electrical current to its input ion current. Hence, the output of an ion detector equipped with an electron multiplier is an amplified electrical current proportional to the intensity of the ion current fed to the ion detector and the gain of the electron multiplier. This output current can be processed as needed to yield a mass spectrum that can be displayed or printed by the readout/display means. A trained analyst can then interpret the mass spectrum to obtain information regarding the sample material processed by the MS system.

Like many analytical techniques, figures of merit are associated with the performance of a mass spectrometer. From the above description of the function of the ion detector, it can be seen that the performance of the ion detector, and particularly the electron multiplier portion, can significantly affect the performance of the mass spectrometer as a whole. Two important figures of merit are sensitivity and dynamic range, which in the present context can provide a measure of the performance of the ion detector employed in an MS system. Insofar as these terms relate to ion detection, for a set gain, sensitivity may be characterized as being the level of output electrical current for a given input ion current. To optimize sensitivity, the gain of the electron multiplier is increased until the signal exceeds all other sources of noise, with an S/N of about 5:1. Ion detectors equipped with electron multipliers are generally more sensitive than other types of ion collectors such as Faraday cups due to the internal amplification provided by the electron multiplier. Dynamic range may be characterized as being the range of output electrical current values over which the electron multiplier will provide a linear response. Dynamic range may be adversely affected by the signal processing circuitry that follows the ion detector. For example, analog-to-digital converters (ADCs) are often provided to transform the analog signals generated by the ion detector to digital signals in order to take advantage of computerized data acquisition hardware and software. In this case, the dynamic range of an ion detector system is usually limited to the range of the ADC. To compensate for this limitation, a user of an MS system has traditionally adjusted the gain of the electron multiplier to optimize either sensitivity or dynamic range. Gain is adjusted by adjusting the high-voltage supply to the electron multiplier. However, increasing sensitivity such as by increasing gain may prematurely stress or age the specialized material that comprises the surfaces of the electron multiplier utilized for electron emission. These surfaces are designed to be operated at a gain that results in an optimum output current providing a good S/N ratio and reasonable service life. Other problems have been found in attempting to optimize sensitivity and dynamic range. For instance, the means taken for extending dynamic range may reduce sensitivity, lower the precision of detected mass peaks, narrow the bandwidth of amplifiers employed in signal processing, and/or limit the maximum scan speed of the mass analyzer. Moreover, there has not existed a sufficient method for increasing both dynamic range and sensitivity, or at least increasing dynamic range without adversely affecting sensitivity. Accordingly, there continues to be a need for improved techniques for optimizing sensitivity and dynamic range in mass spectrometers utilizing electron multipliers.

SUMMARY OF THE INVENTION

To address the foregoing problems, in whole or in part, and/or other problems that may have been observed by persons skilled in the art, the present disclosure provides dynamic adjustment of the control voltage applied to an ion detector and therefore its gain, as described by way of exemplary implementations set forth below.

In one aspect, a method is provided for optimizing a control voltage of an ion detector of a mass spectrometer system. According to the method, an array of data is collected. The data represent mass peaks of a mass scan obtained from operating the mass spectrometer system while the ion detector is set to the current detector gain. The largest peak in the array, or at least a portion of the array (for example, the largest peak from a specified range or ranges within the entire array), is found. Based on the size of the largest peak, a determination is made as to whether the current detector gain should be increased or decreased. If it is determined that the current detector gain should be changed, the control voltage of the ion detector for the subsequent mass scan is adjusted to a new control voltage corresponding to the new detector gain. The just collected data of the array are scaled based on the current detector gain.

In another aspect, the method can be repeated for one or more subsequent mass scans. For instance, if the current detector gain was changed to a new detector gain as a result of the previous iteration of the method, then for the next mass scan the ion detector may be operated at the new control voltage that corresponds to the new detector gain. Once this next mass scan is completed and a new array of data collected, the changed detector gain employed during this next mass scan may be set to be the current detector gain and the method repeated to determine whether the value for this detector gain, and thus the value for the control voltage, should again be changed.

In another aspect, the determination as to whether the detector gain should be changed may be based on a comparison of the largest peak to a full-scale value, which may relate to the limitations of detection or data processing components of the system such as the range of an analog-to-digital converter. The comparison may be implemented as one or more inquiries. For example, if the largest peak is found to be greater than the full-scale value or a percentage of the full-scale value, it may be determined that the detector gain should be reduced. As another example, if the largest peak is found to be less than a percentage of the full-scale value, it may be determined that the detector gain should be increased.

In another aspect, adjustment of the control voltage may be based on pre-existing calibration data such as a control voltage vs. gain curve (or, equivalently, a table) for the ion detector. For instance, once a new detector gain is computed, the control voltage corresponding to the value for this new detector gain may be found by consulting or accessing the control voltage vs. gain curve (or by looking up the control voltage in a table or other set of calibration data that provides a correlation between control voltage and gain).

In another aspect, a method is provided for generating calibration data such as a control voltage vs. gain curve (or, equivalently, a table). In one implementation of this method, prior to an analytical mass scan, a mass scan on a reference sample may be performed to detect one or more reference mass peaks. A first, optimum control voltage for the ion detector is found that corresponds to the gain at which the ion detector should operate to detect a reference mass peak at a specified signal-to-noise ratio. A first calibration point is set to the found optimum control voltage and the corresponding gain. The size of the reference mass peak is decreased to a specified percentage thereof to obtain a target peak size. A second control voltage is found that is sufficient to produce the target peak size and the corresponding gain. A second calibration point is set to the found second control voltage and corresponding gain. A determination is made as to whether a specified number of calibration points have been generated. If not, peak size is again decreased to the specified percentage thereof and an additional calibration point generated. This process may be repeated until it is determined that the specified number of calibration points have been generated.

In another aspect of the method for generating the control voltage vs. gain curve, prior to determining whether a specified number of calibration points have been generated, a determination may be made as to whether the control voltage is equal to or less than a specified lowest control voltage. If the control voltage is greater than the specified lowest control voltage, then the inquiry as to whether a specified number of calibration points have been generated is made at that time. If, however, the control voltage is found to be equal to or less than the specified lowest control voltage, then the current calibration point is set as the last calibration point such that the value of the control voltage corresponding to the last calibration point is the lowest control voltage to be determined for the control voltage vs. gain curve being generated. The size of the target peak is increased to a specified percentage increase thereof to obtain an increased target peak size. A control voltage, which may be the second to last control voltage, is found that is sufficient to produce the increased target peak size and the corresponding gain. Another calibration point, which may be the second to last calibration point, is set to the found control voltage and corresponding gain. A determination is then made as to whether the specified number of calibration points have been generated. If not, the process continues to increase peak size by the specified percentage increase and generate additional calibration points until it is determined that the specified number of calibration points have been generated.

According to another implementation, a signal-bearing medium is provided that includes software for optimizing a control voltage of an ion detector of a mass spectrometer system. The signal-bearing medium comprises logic configured for implementing one or more aspects of the methods described herein.

DETAILED DESCRIPTION OF THE INVENTION

In general, the term "communicate" (for example, a first component "communicates with" or "is in communication with" a second component) is used herein to indicate a structural, functional, mechanical, electrical, optical, magnetic, ionic or fluidic relationship between two or more components or elements. As such, the fact that one component is said to communicate with a second component is not intended to exclude the possibility that additional components may be present between, and/or operatively associated or engaged with, the first and second components.

The subject matter disclosed herein generally relates to dynamic adjustment of the control voltage applied to an electron multiplier to improve performance. Examples of implementations of methods and related devices, apparatus, and/or systems are described in more detail below with reference to FIGS. 1–3. These examples are described in the context of mass spectrometry. However, any process that utilizes an electron multiplier or like component in conjunction with the detection of ions may fall within the scope of this disclosure.

Figure 1:
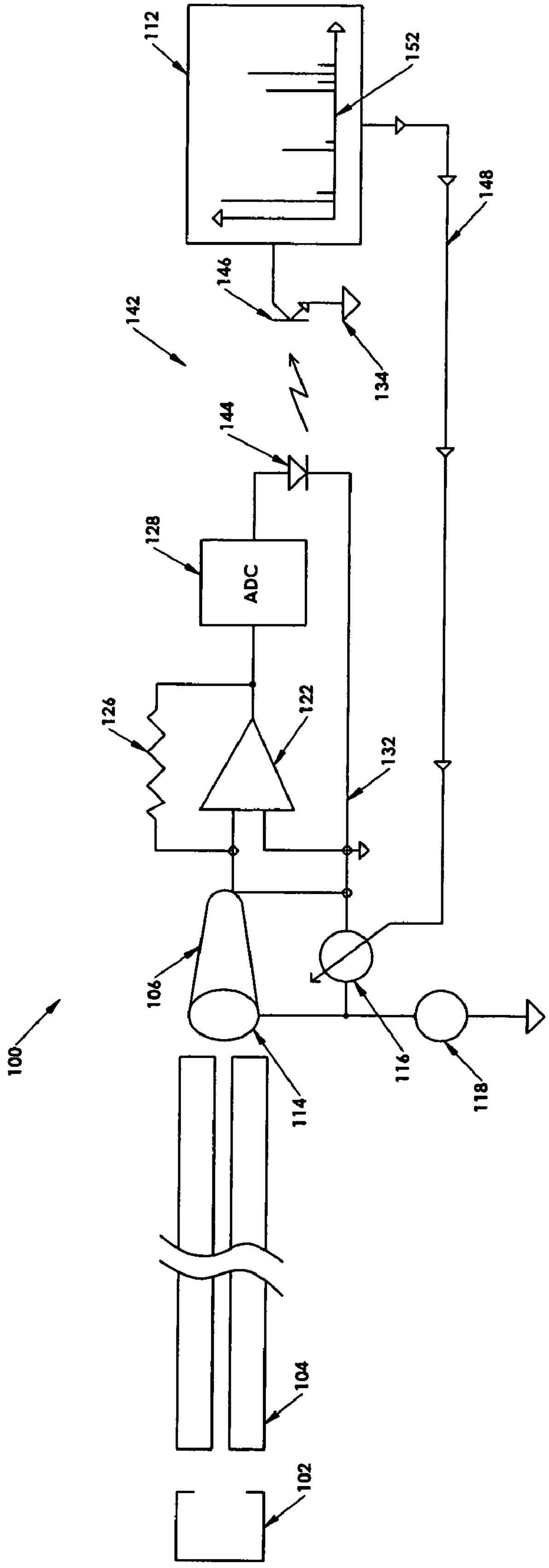
FIG. 1 is a schematic diagram representative of an example of a mass spectrometry system in which the subject matter disclosed herein can be implemented.

FIG. 1 illustrates certain components of a mass spectrometry (MS) system, generally designated 100. MS system 100 may include an ion source 102, a mass analyzer 104, and ion detector 106, a signal processor 108, and an electronic data processor 112. For simplicity, any ion optics (for example, lenses, gates, collision cells, and the like) required between ion source 102, mass analyzer 104, and ion detector 106 or within these components are not specifically shown.

Ion source 102 may be any ion source found to be compatible with the methods herein disclosed and with the type of mass analyzer 104 employed. Examples of ion sources 102 include, but are not limited to, gas-phase ion sources and desorption ion sources. Ion source 102 may be adapted for implementing hard ionization or soft ionization. More specific examples of ion sources 102 include, but are not limited to, electron impact (EI), chemical ionization (CI), field ionization (FI), field desorption (FD), electrospray ionization (ESI), and thermospray ionization (TS). It will be appreciated by persons skilled in the art that MS system 100 may be designed to enable more than one type of ionization technique to be selected. For simplicity, a sample introduction system for MS system 100 is not shown, but it will be understood that any suitable sample introduction system may be employed to introduce the sample to be analyzed into ion source 102, including those associated with hyphenated techniques as previously indicated (for example, GC/MS, LC/MS, and MS/MS).

Mass analyzer 104 may be any type suitable for mass sorting operations. Examples of suitable mass analyzers 104 include, but are not limited to, those of the continuous beam type. Continuous-beam mass analyzers include, but are not limited to, multipole (for example, quadrupole) mass analyzers that comprise one or more multipole electrode structures (for example, quadrupole mass filters), single-focusing magnetic sector analyzers, and double-focusing analyzers that comprise one or more electrostatic analyzers (ESAs) as well as magnetic sector analyzers. As further appreciated by persons skilled in the art, mass analyzer 104 may be a multiple-component mass analyzer capable of performing tandem MS applications (MS/MS analysis) and multiple-MS applications in experiments for which it is beneficial to cause ion fragmentation, such as by collisional-induced dissociation (CID) using an inert gas. A multiple-component mass analyzer may comprise a series of analyzing or filtering units. As one example, a mass analyzer having a QQQ arrangement includes a multipole serving as a first stage mass separator, followed by another multipole serving as a collisional cell, and followed by another multipole serving as a second stage mass separator. As another example, a mass analyzer having an EBEB, BEEB, or like arrangement includes a combination of ESAs and magnetic analyzers, where "E" designates an electrostatic field and "B" designates a magnetic field. Examples of other combinations of analyzers include BQEQ, BEQQ, and QTOF.

Ion detector 106 can be any device capable of converting an ion beam received as an output from mass analyzer 104 into an electrical current, and which includes an electron multiplier (EM) or photomultiplier 114 in which the operating or control voltage and thus the gain can be controlled. For convenience, any type of multiplier 114 referenced herein is termed an electron multiplier or EM. In FIG. 1, electron multiplier is schematically illustrated as being the continuous-dynode type but could also be a discrete-dynode type. A high-voltage source 118 (for example, ±5 kV) provides the electrical potential required to accelerate ions from mass analyzer 104 into ion detector 106. The polarity of the applied voltages depends on whether positive or negative ionization is being implemented. This controls the ion-to-electron conversion efficiency, which is different for each mass and its charge state. As represented by a variable voltage source 116 connected in parallel with electron multiplier 114, the control voltage of electron multiplier 114 can be varied to control the overall electron multiplication (which is the same for all electrons) of electron multiplier 114. In one example, the control voltage may be varied from approximately 600 V to approximately 2 kV.

Signal processor can include one or more components as necessary or desirable for conditioning the current signals produced by ion detector 106 in preparation for post-detection processes such as calibration, scaling, readout/display, et cetera. As one non-limiting example illustrated in FIG. 1, signal processor includes a current-to-voltage amplifier 122 for converting current signals (typically on the order of fA to μA) produced by ion detector 106 to proportional voltage signals. Current-to-voltage amplifier 122 is schematically represented in FIG. 1 by an op-amp (operational amplifier) 124 with feedback through a resistance 126. To convert the data output of current-to-voltage amplifier 122 from the analog domain to the digital domain in preparation for data manipulation, signal processor also includes an analog-to-digital conversion (ADC) device 128. As illustrated in FIG. 1, electron multiplier 114, current-to-voltage amplifier 122, and ADC 128 have a common, high-voltage virtual ground plane 132. Because data processor 112 communicates with a different, much lower ground plane 134, data processor 112 should be electrically isolated from the front-end components of the detection system. Accordingly, by way of example in FIG. 1, an opto-isolation component 142 is provided for coupling the digital output from ADC 128 to the input of data processor 112. Opto-isolation component 142 can include a light emitting diode (LED) 144 that transmits light signals to a phototransistor 146. Data processor 112 communicates with variable voltage source 116 of electron multiplier 114 via a feedback line 148 to enable the control voltage of electron multiplier 114 to be adjusted in accordance with methods described below. The operation of MS system 100 results in the generation of a mass spectrum 152 as illustrated within data processor 112.

As a general matter, data processor 112 in FIG. 1 is a simplified schematic representation of an electronic or computing operational environment for MS system 100. As such, data processor 112 may include, or be part of, a computer, microcomputer, microprocessor, microcontroller, analog circuitry, or the like as those terms are understood in the art. In addition to data acquisition, manipulation, storage and output, data processor 112 may implement any number of other functions such as computerized control of one or more components of MS system 100. Data processor 112 may represent or be embodied in more than one processing component. For instance, data processor 112 may comprise a main controlling component such as a computer in combination with one or more other processing components that implement more specific functions (for example, data acquisition, data manipulation, transmission of information or interfacing tasks between components, et cetera). Data processor 112 may implement various aspects of instrumental control such as temperature, quadrupole voltages (DC and/or RF), ion optics voltages, magnetic or electric field strength, scanning parameters, et cetera Data processor 112 may have both hardware and software attributes. In particular, data processor 112 may be adapted to execute instructions embodied in computer-readable or signal-bearing media for implementing one or more of the algorithms, methods or processes described below, or portions or subroutines of such algorithms, methods or processes. The instructions may be written in any suitable code, one example being C.

Data processor 112 is adapted for implementing a method, for dynamically optimizing both the dynamic range and the sensitivity of the ion detection system by effecting real-time scaling of each analytical mass scan of a mass or range of masses. According to the method, in between successive mass scans, the control voltage of electron multiplier 114 is adjusted to likewise adjust the gain of electron multiplier 114 depending on the signal strength detected by ion detector 106 and processed by ADC 128 (for example, micro-scanning, filtering, centroiding, or the like). In one implementation, to reconstruct the correct signal after it is acquired, the digital values outputted from ADC 128 are adjusted (for example, scaled) according to a prerecorded calibration curve that is a plot of EM control voltage vs. EM gain. Equivalently, this curve may be considered a table in which each value for EM control voltage is correlated with a value for EM gain. For purposes of this disclosure, the terms "curve" and "table" are thus intended to have interchangeable meanings. In practice, the method is capable of extending the dynamic range well beyond the typical limitations of the ADC range. For large signals, the method may extend the dynamic range by several orders of magnitude, for example, greater than 1000.

According to one aspect of the method, a process is provided for establishing an EM control voltage vs. gain curve for calibrating ion detector 106, and is typically carried out prior to the mass scan or scans for which real-time scaling (described below) is implemented. The frequency at which this calibration process is executed—for example, weekly, biweekly, once per month, et cetera—may depend on any number of factors determined by the operator of MS system 100 as being important, such as the age of ion detector 106, how often ion detector 106 is operated, the type of analytical substance being investigated, whether the type of analytical substance being investigated has changed, and so on. As another example, the calibration process may be carried out each time mass analyzer 104 is tuned.

Figure 2:
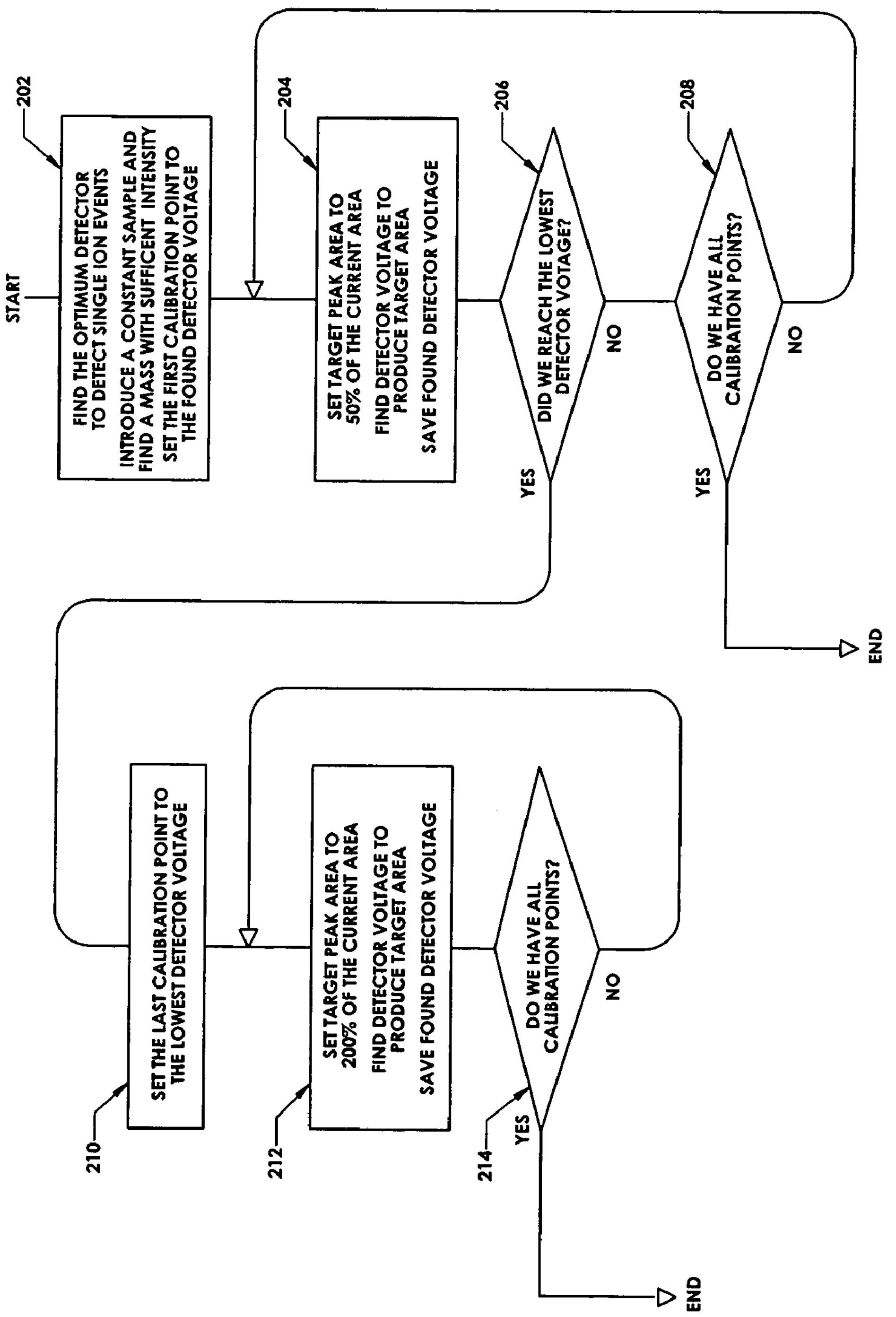
FIG. 2 is a flow diagram illustrating an example of a method for generating calibration data as disclosed herein.

Referring to the flow diagram of FIG. 2, at block 202, a suitable reference or standard compound is run through MS system 100 (FIG. 1) to produce an ion output that is picked up by ion detector 106. An optimum control voltage for electron multiplier 114 is found that corresponds to a detection limit of signal processor 108 in a worst-case scenario. For instance, the optimum control voltage may correspond to the gain at which electron multiplier 114 should operate for detection of the smallest signal likely to be detected from the mass analysis (for example, detection of a single ion event) with a desired signal-to-noise (S/N) value (for example, 5:1), that is, an S/N value considered high enough to be acceptable. Typically, the S/N value may be characterized as the ratio of the output signal produced by ion detector 106 to the background noise detected or picked up by signal processor 108. The optimum control voltage found and corresponding gain are set as the first calibration point and becomes the high end of the calibration curve. At this stage of the process, the optimum control voltage corresponds to the current mass peak area, that is, the peak area just detected.

Next, at block 204, a target mass peak area is set to a lower percentage (for example, 50%) of the current mass peak area. The control voltage that produces or matches this target peak area is found and saved as the next calibration point.

Next, at block 206, an inquiry is made as to whether a desired minimum setting (that is, a predetermined lowest detector voltage) has been reached at this stage. If not, then at block 208, an inquiry is made as to whether all calibration points have been collected according to a desired number of calibration points (for example, 12 points). If not, then the process at block 204 is repeated, that is, the last target mass peak area becomes the current mass peak area and the next target mass peak area is determined by again lowering the current mass peak area by a percentage (preferably, the same percentage as in the previous iteration). The processes at blocks 204 and 206 are repeated (assuming the answer to the inquiry made at block 206 is "no" each time) until all calibration points have been collected, which is determined if the answer to the inquiry made at block 208 becomes "yes", at which time the process of collecting the detector calibration curve or table is complete. For example, if a total of twelve calibration points are to be collected, the current iteration of the control voltage continues to be reduced by half until eleven other calibration points have been collected, in which case the ion signal is reduced by a total of $1/2048$.

If, after a given iteration, at block 206, the newly found control voltage is found to be the minimum predetermined setting (that is, the lowest detector voltage set for the calibration procedure), this control voltage is set to be the low-end setting of the calibration curve at block 210. In this event, all other calibration points desired to be collected (for example, in order to collect a total of twelve points) are established by multiplying the ion signal by a predetermined amount (for example, 200%) at block 212 on every step and re-finding the corresponding detector voltage.

Next, at block 214, an inquiry is then made as to whether all calibration points have been found at this stage of the procedure. If not, the process returns to block 212, and the target peak area is again set to a higher percentage of the current peak area corresponding to the last control voltage found. The process is repeated until it is determined that all calibration points have been collected, at which time the process of collecting the detector calibration curve or table is complete.

The completed calibration curve or table is written to hardware or software within or communicating with data processor 112 (FIG. 1) and used for calibration during subsequent mass scans of analytical samples. The calibration curve remains stored and utilized by MS system 100 until such time as the curve is updated or replaced pursuant to a decision by the operator of MS system 100 to run the calibration process again.

According to another aspect of the method, a process is provided for real-time scaling of each analytical mass scan performed by MS system 100. The scaling procedure may be performed after MS system 100 has been operated at a given detector gain to produce a mass scan. Each mass scan results in an array of processed raw ADC values. From the array of data just collected, the largest data point in the array is found. This data point may be defined as the data point selected as being the "largest" data point to be included in a given mass scan. That is, the data point selected as being the largest data point may in fact be the largest data point in the entire array (corresponding to the strongest signal, or largest mass peak, produced from the mass scan) or, alternatively, this data point may be the largest data point within any specified mass range or ranges of the array. The largest peak may correspond to the highest peak or to the peak having the greatest area.

Next, a determination is made as to whether the current setting for the detector gain should be adjusted for the next scan based on the size of the largest peak found from the last mass scan. In one implementation, the height (or area) of the largest mass peak is compared with a value predetermined as corresponding to the full-scale value of the ion detection system as well as specified percentages of full scale that serve as thresholds determining whether the detector gain should be scaled up or down. The full-scale value may depend on the instrumentation employed in the ion detection system. For example, referring back to the exemplary instrumentation depicted in FIG. 1, the full-scale value may relate to the saturation limit of ADC 128 which, in the present example, may in turn depend on the feedback resistance 126 (FIG. 1) of current-to-voltage amplifier 122. The comparison of the largest mass peak to full scale may comprise one or more inquiries that determine whether the detector gain and hence EM control voltage should be decreased or increased for the next mass scan. If, based on the largest mass peak, it is determined that the detector gain should be changed, the EM control voltage is adjusted to a value corresponding to the newly determined detector gain, and the newly determined EM control voltage and corresponding detector gain may be employed for the next scan. In addition, all ADC values of the raw scan data are scaled according to the detector gain employed during the scan that collected the data (that is, the last scan), and the scaled data are released to the system for display, data collection, or the like. If a subsequent mass scan is to be implemented, the newly found detector gain is employed for this mass scan as previously indicated.

According to one implementation, the following inquiries are made. If the largest mass peak is greater than, equal to, or close to the full-scale value, then the detector gain value is decremented by a predetermined amount (for example, a number of steps). If, instead, the largest mass peak is less than the full scale value but greater than a predetermined percentage of the full scale value (for example, a first specified percentage), then the detector gain value is decremented by a different predetermined amount. If, instead, the largest mass peak is less than another predetermined percentage of the full scale value (for example, a second specified percentage), then the detector gain is incremented by a predetermined amount. If any inquiries such as these result in a decision to change (increment or decrement) the detector gain, the EM control voltage is adjusted accordingly for the next scan. The adjustment of the EM control voltage may be based on the newly found detector gain utilizing the calibration data (for example, control voltage vs. gain curve or table) generated in the process described above with reference to FIG. 2. As indicated above, in addition to adjusting the EM control voltage, all raw ADC values are scaled up or down based on the detector gain employed while the scan was collected, and the scaled data are released to the system for display, data collection, et cetera In one implementation, the value for detector gain is a number between 1.0 and $\frac{1}{2}^x$, where x is a specified integer. For example, if x=10, the detector gain ranges from 1.0 to $1/(2^{10})$, or 1.0 to 1/1024 (1.0 to 0.0009765). A detector gain of 1.0 may correspond to the control voltage employed to obtain the best S/N ratio.

Figure 3:
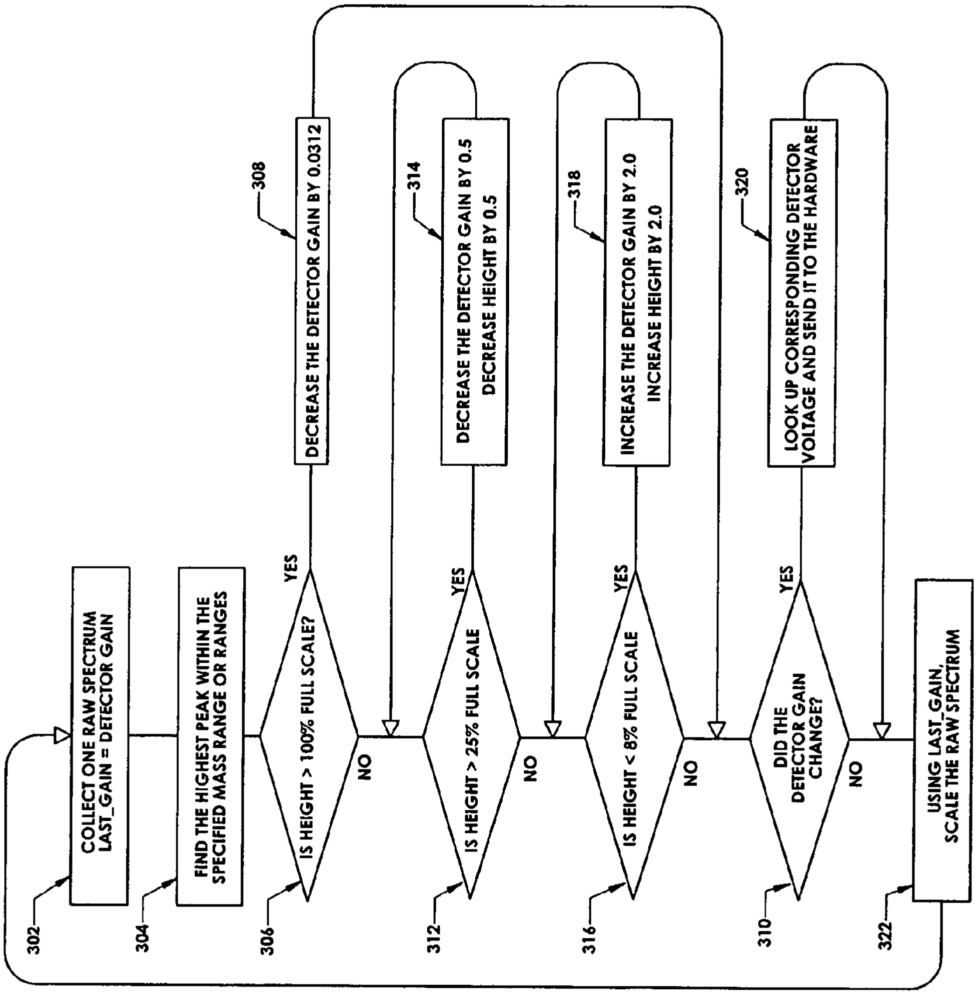
FIG. 3 is a flow diagram illustrating an example of a method for real-time scaling of analytical data as disclosed herein.

A more specific example of an implementation of the real-time scaling process will now be described with reference to FIG. 3. At block 302, the first raw spectrum is collected. A variable employed by the algorithm (for example, "LAST_GAIN") is set to the value of the detector gain employed while obtaining this spectrum. At block 304, the largest mass peak in the array just collected (which may be the full array or at least a portion of the array that corresponds to a specified mass range or ranges) is found. At block 306, an inquiry is made as to whether the largest mass peak is greater than 100% of full scale. If the largest mass peak is greater than, equal to, or close to 100% (for example, greater than approximately 100%) of full scale, then, at block 308, the detector gain is decremented by a factor of 32 or $2^5$ (that is, divided by 32 or $2^5$ or multiplied by 1/32 or 0.0312) and the process then passes to the inquiry at block 310 (described below). If the largest mass peak is not greater than 100% of full scale, then, at block 312, an inquiry is made as to whether the largest mass peak is greater than a specified percentage (for example, 25% or approximately 25%) of full scale. If the largest mass peak is greater than approximately 25% of full scale, then, at block 314, the detector gain is decremented by a factor of 2 or $2^1$ (that is, divided by 2 or $2^1$ or multiplied by ½ or 0.5), and the height (or area) of the largest mass peak is likewise decreased by 0.5. The inquiry at block 312 is then repeated. If the new peak height (set by the previous iteration of the process at blocks 312 and 314) is again found to be greater than approximately 25% of full scale, the decrementing process at block 312 is again carried out. This loop is repeated until the peak height is no longer found to be greater than approximately 25% of full scale, at which stage the process passes to block 316.

At block 316, an inquiry is made as to whether the mass peak is less than another specified percentage (for example, 8% or approximately 8%) of full scale. If the mass peak is less than approximately 8% of full scale, then, at block 318, the detector gain is incremented by a factor of 2 or $2^1$ (that is, increased by 2.0), and the height (or area) of the mass peak is likewise increased by 2.0. The inquiry at block 316 is then repeated. If the new peak height (set by the previous iteration of the process at blocks 316 and 318) is again found to be less than approximately 8% of full scale, the incrementing process at block 318 is again carried out. This loop is repeated until the peak height is no longer found to be less than approximately 8% of full scale, at which stage the process passes to block 310.

Block 310 optimizes the time it takes to send the control output and settle the EM output voltage. At block 310, an inquiry is made as to whether the detector gain has changed (or whether a decision to change the detector gain has been made). If the detector gain has not changed, the run-time feedback process illustrated in FIG. 3 ends for this last acquired mass scan, and the raw spectrum is scaled at block 322 in accordance with the detector gain employed to acquire this last mass scan. If, however, the detector gain has changed, then, at block 320, the EM control voltage is changed to a value needed to realize the newly found detector gain as determined from the process performed at blocks 304–318. For instance, referring to FIG. 1, an appropriate control signal may be sent from data processor 112 via feedback line 148 to variable voltage source 116 in preparation for the next mass scan to be performed by MS system 100. As previously indicated, the new control voltage may be determined based on the new detector gain as correlated in the pre-existing calibration data obtained by the process previously described and illustrated in FIG. 2. Referring back to FIG. 3, at block 322, the raw spectrum is then scaled and the data are released to be displayed, saved on disk, et cetera The process returns to block 302 for collecting and scaling of the next mass scan. This next mass scan is carried out utilizing the value for detector gain (and control voltage) computed from the previous iteration of the scaling process just described.

By employing this real-time (or run-time) scaling process, both the sensitivity and dynamic range of the instrumentation for each mass scan is optimized, thereby improving data acquisition. The dynamic range is no longer limited by the components of the ion detection system. The method has also been found in most cases to increase the S/N ratio in typical MS applications, and does not reduce the precision of ion height in any mass range, since only the electron multiplication stage is changed and not the ion-to-electron conversion efficiency (which would be mass dependent). In addition, because the methods may be implemented by data processor 112 (FIG. 1), the user of MS system 100 does not need to select an EM detector gain and thus does not need to know how the detector system works. Accordingly, the method is transparent to the user. Moreover, a small change in EM control voltage allows for a much larger change in EM gain. For example, a voltage change of 50V corresponds to a 50% change in gain. However, at all times during operation of MS system 100, the method ensures that the output current of electron multiplier 114 is kept below a maximum such that electron multiplier 114 is not unnecessarily stressed or aged, even while detecting large ion currents. The advantages provided by the method can be applied to all typical MS operation modes (for example, MS, MS/MS, selected ion monitoring or SIM, multiple reaction monitoring or MRM, et cetera).

It will be understood that the methods or processes described above could also be implemented on peak by peak bases instead of the more specifically above-described scan by scan bases. Instead of the step-type real-time feedback process illustrated in FIG. 3, other types of feedback functions could be employed, such as, for example, proportional, integral, or differential functions, or combinations of these functions.

It will be further understood, and is appreciated by persons skilled in the art, that one or more processes, sub-processes, or process steps described in connection with FIGS. 2 and/or 3 may be performed by hardware and/or software. If the process is performed by software, the software may reside in software memory (not shown) in a suitable electronic processing component or system such as, for example, data processor 112 schematically depicted in FIG. 1. The software in software memory may include an ordered listing of executable instructions for implementing logical functions (that is, "logic" that may be implemented either in digital form such as digital circuitry or source code or in analog form such as analog circuitry or an analog source such an analog electrical, sound or video signal), and may selectively be embodied in any computer-readable (or signal-bearing) medium for use by or in connection with an instruction execution system, apparatus, or device, such as a computer-based system, processor-containing system, or other system that may selectively fetch the instructions from the instruction execution system, apparatus, or device and execute the instructions, one example being data processor 112 schematically depicted in FIG. 1. In the context of this document, a "computer-readable medium" and/or "signal-bearing medium" is any means that may contain, store, communicate, propagate, or transport the program for use by or in connection with the instruction execution system, apparatus, or device. The computer readable medium may selectively be, for example, but is not limited to, an electronic, magnetic, optical, electromagnetic, infrared, or semiconductor system, apparatus, device, or propagation medium. More specific examples, but nonetheless a non-exhaustive list, of computer-readable media would include the following: an electrical connection (electronic) having one or more wires, a portable computer diskette (magnetic), a RAM (electronic), a read-only memory "ROM" (electronic), an erasable programmable read-only memory (EPROM or Flash memory) (electronic), an optical fiber (optical), and a portable compact disc read-only memory "CDROM" (optical). Note that the computer-readable medium may even be paper or another suitable medium upon which the program is printed, as the program can be electronically captured, via for instance optical scanning of the paper or other medium, then compiled, interpreted or otherwise processed in a suitable manner if necessary, and then stored in a computer memory.

It will be further understood that various aspects or details of the invention may be changed without departing from the scope of the invention. Furthermore, the foregoing description is for the purpose of illustration only, and not for the purpose of limitation—the invention being defined by the claims.

What is claimed is:

1. A method for optimizing a control voltage of an ion detector of a mass spectrometer system, comprising:

(a) collecting an array of data representing mass peaks of a mass scan obtained from operating the mass spectrometer system while the ion detector is set to a current detector gain;

(b) finding the largest peak in the array or at least a portion of the array;

(c) based on a size of the largest peak, determining whether the current detector gain should be changed to a new detector gain;

(d) obtaining the new detector gain and adjusting a control voltage at which the ion detector is to operate during a subsequent mass scan to a new control voltage corresponding to the new detector gain; and (e) scaling the data of the array based on the current detector gain.

2. The method according to claim 1, comprising, after adjusting the control voltage to the new control voltage, operating the mass spectrometer system with the ion detector set to the new control voltage to obtain a subsequent array of data.

3. The method according to claim 2, comprising defining the new detector gain as the current detector gain and repeating steps (a)–(e) to process the subsequent array of data.

4. The method according to claim 1, wherein, obtaining the new detector gain comprising changing the value for the current detector gain by one or more steps, and wherein the steps are in a power of two to each other.

5. The method according to claim 1, wherein determining comprises comparing the largest peak to a value corresponding to a full-scale condition of the mass spectrometer system.

6. The method according to claim 5, wherein the full-scale condition corresponds to a saturation limit of an analog-to-digital converter employed to output the array of data.

7. The method according to claim 5, wherein comparing comprises determining whether the largest peak is greater than, equal to, or near to the full-scale value and, if so, decreasing the current detector gain by a predetermined amount to obtain the new detector gain.

8. The method according to claim 5, wherein comparing comprises determining whether the largest peak is greater than a percentage of the full-scale value and, if so, decreasing the current detector gain by a predetermined amount to obtain the new detector gain.

9. The method according to claim 8, wherein, if the current detector gain is decreased, reducing the size of the peak by a corresponding predetermined amount and determining whether the reduced peak is still greater than the percentage of the full-scale value and, if so, decreasing the new detector gain by the predetermined amount, and repeating this step until it is determined that the reduced peak is no longer greater than the percentage.

10. The method according to claim 8, wherein the percentage is approximately 25%.

11. The method according to claim 5, wherein comparing comprises determining whether the largest peak is less than a percentage of the full-scale value and, if so, increasing the current detector gain by a predetermined amount to obtain the new detector gain.

12. The method according to claim 11, wherein, if the current detector gain is increased, increasing the size of the peak by a corresponding predetermined amount and determining whether the increased peak is still less than the percentage of the full-scale value and, if so, increasing the new detector gain by the predetermined amount, and repeating this step until it is determined that the increased peak is no longer less than the percentage.

13. The method according to claim 12, wherein the percentage is approximately 8%.

14. The method according to claim 5, wherein comparing comprises:

determining whether the largest peak is greater than a first percentage of the full-scale value and, if so, decreasing the current detector gain by a first predetermined amount to obtain the new detector gain; and if it is determined that the largest peak is not greater than the first percentage, then determining whether the largest peak is less than a second percentage of the full-scale value and, if so, increasing the current detector gain by a second predetermined amount to obtain the new detector gain.

15. The method according to claim 5, wherein comparing comprises:

determining whether the largest peak is greater than a first percentage of the full-scale value and, if so, decreasing the current detector gain by a first predetermined amount to obtain the new detector gain;

if it is determined that the largest peak is not greater than the first percentage, then determining whether the largest peak is greater than a second percentage of the full-scale value and, if so, decreasing the current detector gain by a second predetermined amount to obtain the new detector gain; and if it is determined that the largest peak is not greater than the second percentage, then determining whether the largest peak is less than a third percentage of the full-scale value and, if so, increasing the current detector gain by a third predetermined amount to obtain the new detector gain.

16. The method according to claim 1, wherein adjusting the control voltage is based on a control voltage versus gain curve for the ion detector.

17. The method according to claim 16, comprising generating the control voltage versus gain curve for the ion detector by:

(a) finding a first, optimum control voltage for the ion detector corresponding to a gain at which the ion detector should operate to detect a reference mass peak at a specified signal-to-noise ratio;

(b) setting a first calibration point to the found optimum control voltage and the corresponding gain;

(c) decreasing a size of the reference mass peak to a specified percentage thereof to obtain a target peak size;

(d) finding a second control voltage sufficient to produce the target peak size and the corresponding gain;

(e) setting a second calibration point to the found second control voltage and corresponding gain; and (f) determining whether a specified number of calibration points have been generated and, if not, continuing to decrease peak size by the specified percentage and generating additional calibration points until it is determined that the specified number of calibration points have been generated.

18. The method according to claim 17, wherein the reference mass peak corresponds to a smallest signal detected during the mass scan on the reference sample.

19. The method according to claim 17, comprising, prior to determining whether a specified number of calibration points have been generated:

(a) determining whether the last control voltage found is equal to or less than a specified lowest control voltage;

(b) if the last control voltage found is greater than the specified lowest control voltage, then performing step (f) of claim 17;

(c) if the last control voltage found is equal to or less than the specified lowest control voltage, then setting the current calibration point as the last calibration point, whereby the value of the control voltage corresponding to the last calibration point is the lowest control voltage to be determined for the control voltage versus gain curve being generated;

(d) increasing the size of the target peak to a specified percentage increase thereof to obtain an increased target peak size;

(e) finding a control voltage sufficient to produce the increased target peak size and the corresponding gain;

(f) setting an additional calibration point to the control voltage just found and corresponding gain; and (g) determining whether the specified number of calibration points have been generated and, if not, continuing to increase peak size by the specified percentage increase and generating additional calibration points until it is determined that the specified number of calibration points have been generated.

20. A computer readable medium including software for optimizing a control voltage of an ion detector of a mass spectrometer system, the computer readable medium comprising logic configured for implementing steps (a)–(e) of claim 1.

* * * * *